United States Patent
Puri et al.

(10) Patent No.: US 7,324,026 B2
(45) Date of Patent: Jan. 29, 2008

(54) OPTIMIZATION OF DECODER MEMORY USAGE FOR VLC TABLES

(75) Inventors: Rohit Puri, San Jose, CA (US); Partha Sriram, Los Altos, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 11/437,206

(22) Filed: May 19, 2006

(65) Prior Publication Data
US 2007/0268166 A1 Nov. 22, 2007

(51) Int. Cl.
*H03M 7/40* (2006.01)
(52) U.S. Cl. .......................... 341/67; 341/107
(58) Field of Classification Search ........... 341/106, 341/107, 67; 711/133, 122
See application file for complete search history.

(56) References Cited

U.S. PATENT DOCUMENTS 6,047,357 A * 4/2000 Bannon et al. ............. 711/133
6,675,282 B2 * 1/2004 Hum et al. .................. 711/213

* cited by examiner

*Primary Examiner*—Brian Young

(57) ABSTRACT

Systems and methods for optimizing system performance in variable length decoding systems are described. Embodiments are described in which decode tables are analyzed and elements of the tables sorted by probability of occurrence. Storage of elements can be determined by probability of occurrence and embodiments of the present invention can optimize system efficiency by storing most likely entries into fast-memory and least likely entries in slowest memory. In certain embodiments, a single large table is provided that cannot fit into decoder fast-memory. In some embodiments, individual elements can be optimized for storage in fast-memory by selecting more frequently occurring entries or groups of entries into decoder memory.

18 Claims, 2 Drawing Sheets

OPTIMIZATION OF DECODER MEMORY USAGE FOR VLC TABLES

BACKGROUND OF THE INVENTION

1. Field of the Invention

The present invention generally relates to variable length decoding. More particularly, the present invention relates to systems and methods for storing multiple decode tables to optimize system efficiency.

2. Description of Related Art

Variable length coding (VLC), comprising variable length encoding (VLE) and variable length decoding (VLD), is a popular method used for lossless compression of data. Examples of systems that use VLC based compression-decompression include conventional speech, audio, image and video solutions. Examples of coding applications and standards that use VLC based compression-decompression include file compression utilities such as zip and gzip as well as speech, audio, images and video systems based on standards such as the Advanced Audio Coding (AAC) audio compression standard, MPEG-3 (audio), JPEG, JPEG2000 (images), MPEG-4, and H.264 (video). In many compression/decompression applications, large-sized tables as well as multiple VLC tables are used for efficient data compression. Size limitations on available fast-memory in decoder systems often render it impossible to accommodate an entire set of tables. Consequently, system performance and efficiency is frequently compromised in many conventional systems.

VLC can offer significant compression benefits over fixed length coding (FLC) n the following example as illustrated in Table 1. In the example, a source X has a four symbol alphabet denoted by the letter codes A, B, C, and D. As shown in Table 1, each symbol has an associated probability of occurrence and binary representations are provided for the letter codes.

TABLE 1

Encoder code book for fixed length code with codeword length of 2 bits.

| SYMBOL | PROBABILITY | FLC |
|---|---|---|
| A | 0.50 | 00 |
| B | 0.25 | 01 |
| C | 0.125 | 10 |
| D | 0.125 | 11 |

Thus, under FLC schemes, an average codeword length of two is obtained because every symbol uses a binary codeword of length 2.

Table 2 illustrates a VLC based encoder codebook in which shorter code-length codes are assigned to higher probability symbols.

TABLE 2

Encoder code book for a Variable length code. Average codeword length is 1.75 bits.

| SYMBOL | PROBABILITY | FLC |
|---|---|---|
| A | 0.50 | 0 |
| B | 0.25 | 10 |
| C | 0.125 | 110 |
| D | 0.125 | 111 |

In this case the average codeword length is given by:

$$ACL=(0.5\times1)+(0.25\times2)+(0.125\times3)=1.75,$$

thus providing decreased overall storage requirements over FLC. In essence, VLC attains better compression performance than FLC by encoding more likely symbols using smaller length code-words.

In many compression/decompression applications, large-sized tables as well as more than one VLC tables are used for efficient data compression. For example, AAC comprises between 10 and 15 tables, each having a large number of entries. Some of the AAC tables include as many as 300 entries. In many conventional systems encoders switch between different VLC tables based on the raw data presented, in order to efficiently encode the data. The encoder communicates switching decisions to the decoder through the bit-stream itself, so that the decoder can maintain synchronization with the encoder. However, commercial products that contain such speech, audio, image, and video solutions often have only limited fast-memory resources in the interest of maintaining minimal system costs and can accommodate only a portion of all required tables in fast-memory. Therefore, in conventional commercial products system performance is often limited by the use of slow-memory in decoding.

BRIEF SUMMARY OF THE INVENTION

Certain embodiments of the invention provide efficient systems and methods for optimizing storage of VLC tables. In some embodiments, significant advantages may be accrued including the conservation of memory resources. Some embodiments implement strategies for identifying sub-sets of VLC tables for storage into selected decoder memory such that efficiency of system performance is maximized. In certain embodiments, identified sub-sets can be allocated to different storage components based in part on speed of memory access and frequency of use of the identified sub-sets.

BRIEF DESCRIPTION OF THE DRAWINGS

The present invention is illustrated by way of example, and not limitation, in the figures of the accompanying drawings in which like references denote similar elements, and in which.

DETAILED DESCRIPTION OF THE INVENTION

The present invention will now be described in detail with reference to the drawings, which are provided as illustrative examples of the invention so as to enable those skilled in the art to practice the invention. Notably, the figures and examples below are not meant to limit the scope of the present invention. Where certain elements of the present invention can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the known components referred to herein by way of illustration.

Embodiments of the invention can deliver significant performance improvements in decoding systems through optimized use of available storage. In many embodiments, the decoding systems can be used to decode bitstreams encoded using VLC based compression-decompression methods. In certain embodiments, bitstreams may include data compressed using file compression utilities such as zip and gzip. In certain embodiments, bitstreams may include speech, audio, image and video information encoded using encoding schemes including standards such as the Advanced Audio Coding (AAC) audio compression standard, MPEG-3 (audio), JPEG, JPEG2000 (images), MPEG-4, and H.264 (video). In certain embodiments, large decode tables are required for decoding bitstreams. In certain embodiments, multiple VLC tables are required for decoding an individual bitstream.

Figure 1:
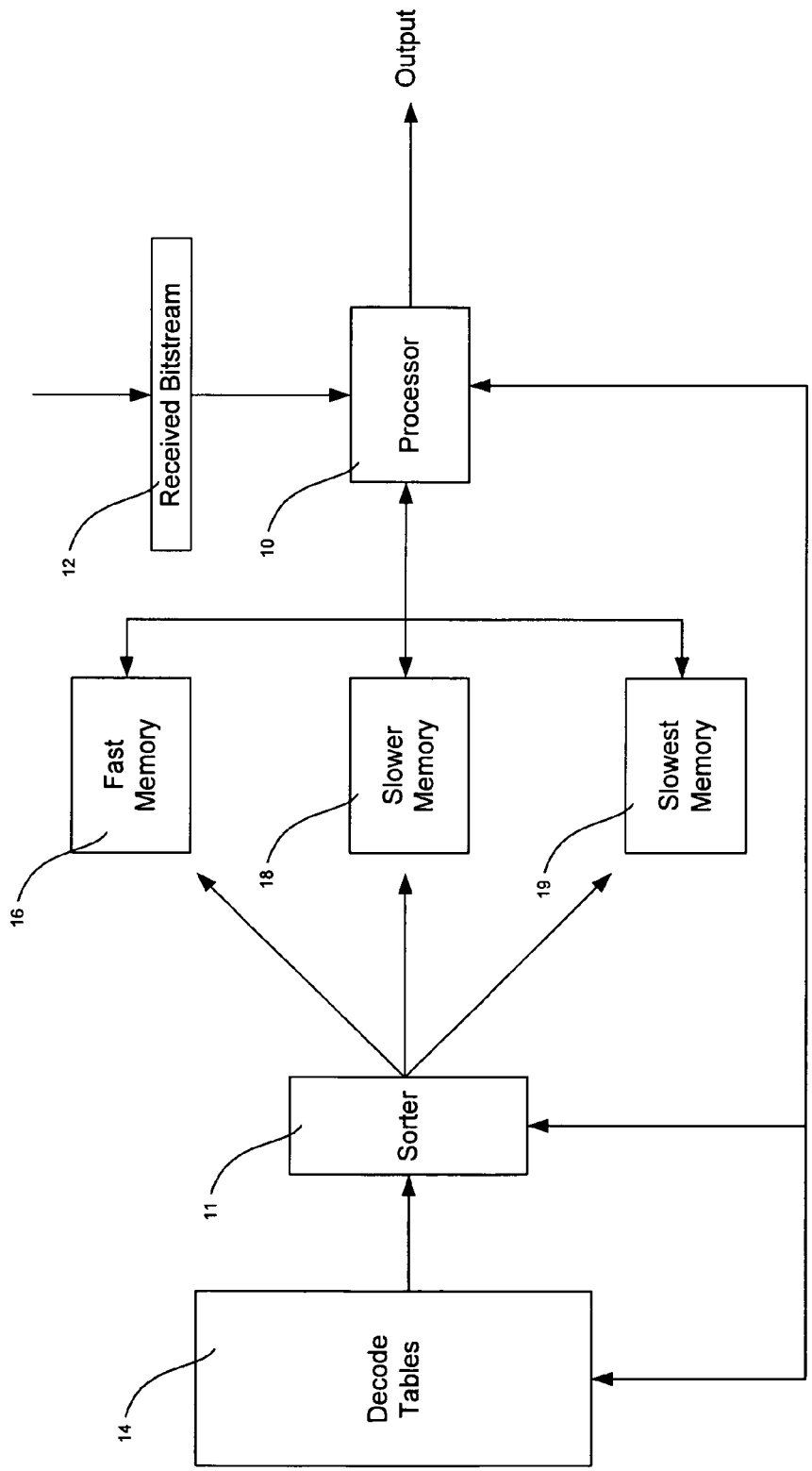
FIG. 1 illustrates a decoding system for optimizing memory usage.

Referring to FIG. 1, certain embodiments of the invention comprise a decoding system having a limited amount of superior storage supplemented with inferior storage. Storage is typically considered superior when use of the storage yields better system performance than use of inferior storage. In certain embodiments, each storage area or component can be assigned a system cost that quantifies effects on performance associated with use of the storage area or component. In many embodiments, system costs correlate with access time of memory devices used to implement a storage area. For example, static memory collocated on a processor typically provides better access times than static memory accessed over an external system bus. In many embodiments, other factors may be considered in assessing system cost. For example, system cost may be adjusted based on factors including power consumption of memory devices. In another example, system cost may include a measurement associated with degradation of overall system performance due to exhaustion of available fast memory or other types of storage. In at least some embodiments, predetermined quantities or proportions of certain storage types may be reserved for system usage, thereby limiting the amount of available storage of a particular type. It will be appreciated that limitations on availability of storage types is not necessarily limited to fast-memory, since system input/output (including bitstream) buffering requirements may necessitate the reservation of quantities of slower memory.

Certain embodiments include one or more superior (low cost) storage areas and a complement of inferior (higher cost) storage areas 18 and 19. In the simplified example of FIG. 1, superior storage areas are implemented using fast memory 16 and inferior storage areas are implemented using slower memory 18 and even slower memory 19. Typically, a processor 10 is provided to receive and control decoding of a bitstream 12. Processor 10 may include a combination of dedicated sequencers, general purpose microprocessors or microcontrollers and digital signal processors. In many embodiments, processor 10 receives portions of the bitstream and indexes one or more relevant tables (e.g. VLC table) stored in memory 16, 18 and 19. In many embodiments, tables can be stored in memory having one or more access speeds. For example, internal register or static memory collocated with processor 10 within an application-specific integrated circuit (ASIC) may be designated as fast memory 16 while dynamic access memory (DRAM) external to the ASIC could be used for slowest memory 19 with static external memory providing an intermediate memory 18.

In certain embodiments, processor 10 may also be adapted to receive and extract decode tables 14 from bitstream 12. In some embodiments, processor 10 may be adapted to sort and arrange decode tables 14 in storage 16, 18 and 19. In at least some embodiments, a sorter 11 is provided to analyze decode tables and to calculate probabilities of use of selected elements and portions of decode tables 14. In certain embodiments, sorter 11 can be configured to extract probability information provided with the decode tables 14. In certain embodiments, sorter 11 may include a component for measuring usage of the sorted decode tables and, based on the measurements, update usage probabilities for table elements and portions. Based on the updated probability information, in some embodiments, tables 14 can be reapportioned among the fast and slow memories 16, 18 and 19.

In certain embodiments, sorter 11 can be implemented as a combination of hardware and software. For example, in some embodiments, sorter may be implemented using a microprocessor, digital signal processor or ASIC and may control, be controlled by or otherwise cooperate with processor 10. In certain embodiments, sorter 11 can be implemented as a process, task or function executed by processor 10. Processor 10 can typically maintain one or more decode tables 14 in a combination of volatile and non-volatile storage devices including flash memory, disk drive, dynamic memory and static memory. In certain embodiments, processor 10 can receive new decode tables 14 through received bitstreams, by network or other communications and by removable storage devices.

In certain embodiments, processor 10 selects one or more sets of decode table for decoding a current bitstream. Portions of the selected sets of decode tables are typically allocated to fast memory 16 and slower memories 18 and 19 based on probabilities of occurrence in a bitstream of symbols decoded by the selected tables. In certain embodiments, each table in a set of decode tables can initially be stored in a storage area selected based on an aggregate probability for the stored table. In certain embodiments, storage commences with sorting elements of a set of tables based on probabilities associated with the elements. In certain embodiments, decode tables can be preloaded or preallocated to fast and slow memories 16, 18 and 19.

It will be appreciated that, for a system including a quantity N of VLC tables, $T_1, T_2, \ldots T_N$ that are available to the encoder and the decoder, size of a table is denoted as $S_i$, where:

$$i \in \{1, 2, \ldots N\}.$$

Where the probability of a particular table being used by the encoder is $P_{Ti}$, $$\sum_{i=1}^{N} P_{Ti} = 1. \tag{1}$$

For table $T_i$, its $j^{th}$ entry is denoted by $e_j^{Ti}$ where $j \in \{1, 2, \ldots S_i\}$ and the conditional probability of occurrence of the $j^{th}$ codeword can be denoted by $p_j^{Ti}$. Thus:

$$\sum_{j=1}^{S_i} p_j^{Ti} = 1 \ \forall \ i \in \{1, 2, \ldots N\}. \tag{2}$$

In certain embodiments, the decoder system has a fast-memory of size S and it can be stated that:

$$\sum_{i=1}^{N} S_i > S.$$

Further, a single access of a VLC table entry from the decoder fast-memory may have an associated system cost of $c_f$ and a single access of a VLC table entry from outside the decoder fast-memory may have an associated system cost $c_s$ such that $c_f<c_s$. In a decoder system with a total of N accesses out of which $N_f$ accesses from the fast-memory, the total average cost per access denoted by C is given by $$C = \frac{N_f}{N} c_f + \left(1 - \frac{N_f}{N}\right) c_s \quad (3)$$

In many embodiments of the invention, fast-memory is populated with VLC table entries in such a way that the total average cost C is minimized. Unconditional probability associated with the entry $e_j^{Ti}$ may be calculated as:

$$l_j^{Ti} = P_{Ti} \times p_j^{Ti}. \quad (4)$$

The sum of all unconditional probabilities is equal to 1, and therefore:

$$\sum_{i=1}^{N} \sum_{j=1}^{Si} l_j^{Ti} = 1.$$

In one example, an arbitrary two-way partitioning of all the entries across all the tables may be implemented. The first partition, $P_f$, contains a total of S entries, picked from various tables, and corresponding to entries stored in fast-memory. The second partition, $P_s$, contains the remaining $$\sum_{i=1}^{N} S_i - S$$

entries, corresponding to entries stored outside of fast-memory. Where the sum of the probabilities of all the entries in partition $P_f$ is given by $p_f$ and the sum of the probabilities of all the entries in partition $P_s$ is given by $p_s$ (note that $p_f+p_s=1$), equation (3) provides a total average cost associated with this strategy is given by $$C = p_f c_f + p_s c_s.$$

It will be appreciated that one of the entries in $P_f$ has a smaller unconditional probability (denoted by 1) than the unconditional probability (denoted by L, L>1) of an entry in $P_s$. By swapping the two entries between the two partitions, system cost can be decreased from the original configuration by an amount given by $\Delta C$ as follows:

$$\Delta C = (L-1) \times (c_s - c_f)$$

$\Delta C$ is strictly positive since L>1 and $c_s>c_f$. Thus, by iteratively moving lower probability entries into $P_s$ and higher probability entries into $P_f$ system cost can be continually decreased. In certain embodiments, an optimal configuration corresponds to the case when the unconditional probabilities of all the entries in $P_f$ are larger than all the entries in $P_s$. In certain embodiments swapping of elements may continue until a predetermined maximum total average cost has been achieved.

Figure 2:
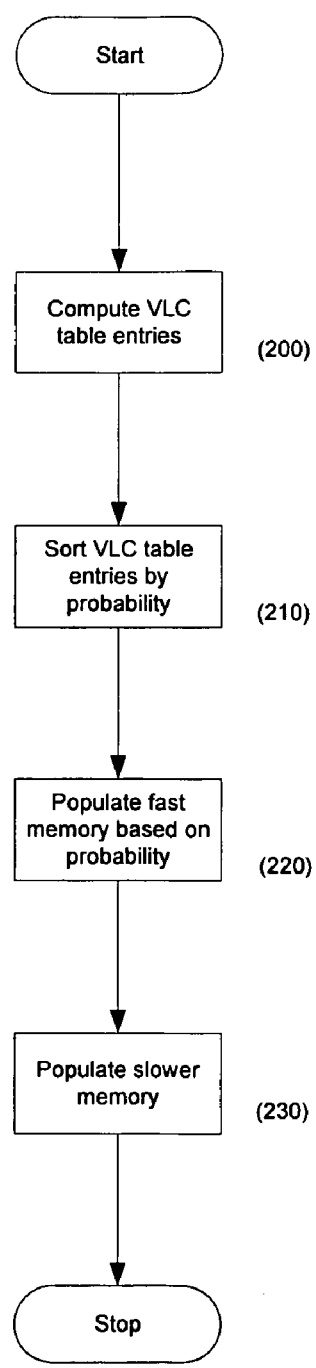
FIG. 2 depicts a flowchart for sorting and arranging VLC tables in available memory.

One example of an algorithm for decreasing system cost is provided in FIG. 2. At step 200, unconditional probabilities are typically computed for all VLC table entries. In some embodiments, processor 10 may calculate probabilities using equation (4). At step 210, VLC table entries 14 can be sorted by sorter 11 and arranged in decreasing order of probabilities. At step 220, a quantity S of entries are used to populate available decoder fast-memory 16. Typically, the entries used for such filling will be the first S entries in the sorted list. At step 230, when fastest memory is full, the next fastest memory 18 is typically populated based on the probabilities associated with remaining VLC table entries. When slower memory 18 is filled, other (slowest) memory 19 can be used to store remaining VLC table entries. In this manner, VLC tables can be optimally partitioned and system efficiency can be maximized.

A simple numerical example is now provided to illustrate the efficiency of systems implementing the presently described system. In the example, two VLC tables, $T_1$ and $T_2$, are provided such that each table has two entries resulting in a total of four entries and table probabilities as shown in Table 3. It is apparent that $T_1$ is four times as much likely to be used as $T_2$.

TABLE 3

Illustrative Example: Table probabilities

| TABLE | PROBABILITY |
|---|---|
| $T_1$ | 0.8 |
| $T_2$ | 0.2 |

The probabilities of the entries of $T_1$ and $T_2$ are as given in Table 4. In this example, a decoder fast-memory is provided with size S=2, capable of accommodating only two of the four possible entries. Further, the fast-memory access cost $c_f=1$ and $c_s=K$ where K>1.

TABLE 4

Illustrative Example: Entry Probabilities for $T_1$ and $T_2$

| TABLE | CONDITIONAL PROBABILITY | UNCONDITIONAL PROBABILITY |
|---|---|---|
| $e_1^{T1}$ | 0.95 | 0.76 |
| $e_2^{T1}$ | 0.05 | 0.04 |
| $e_1^{T2}$ | 0.90 | 0.18 |
| $e_2^{T2}$ | 0.10 | 0.02 |

The approach of storing the complete "most-likely" table $T_1$ in fast-memory results in an average cost $C_{ref}$ given by:

$$C_{ref} = 1 \times (0.76 + 0.04) + K \times (0.18 + 0.02) = 0.8 + K \times 0.2.$$

Upon implementing the sorting algorithm provided above, average cost is:

$$C_{sort} = 1 \times (0.76 + 0.18) + K \times (0.04 + 0.02) = 0.94 + K \times 0.06,$$

yielding an improvement by:

$$C_{ref} - C_{sort} = (0.18 - 0.04) \times (K - 1),$$

which is strictly positive.

As shown by this example, embodiments of the present invention can provide optimal system efficiency because most likely entries of the decode tables can be located in fast-memory while least likely entries are stored in slowest memory, thereby achieving minimum aggregate system cost. Furthermore, the example illustrates that improvements over other approaches can be obtained. For example, the loading of whole tables into fast-memory in decreasing order of the table probabilities is often sub-optimal because in an unconditional sense, some entries in the more likely tables might have lesser probability of occurring than some entries in less likely tables.

In certain embodiments, a single large table is provided that will not fit into available decoder fast-memory 16. In such embodiments, individual elements can be optimized for storage in available fast-memory 16 by selecting more frequently occurring entries or groups of entries for storage into fast-memory 16. When available fast-memory 16 has been filled, remaining table entries or groups of entries can be allocated to slower memory or memories 18 and 19.

In certain embodiments one or more VLC tables are provided for decoding a bitstream wherein elements of the one or more VLC tables are associated with probabilities of occurrence. In some of these embodiments, the elements are sorted according to these probabilities, wherein each probability is indicative of the frequency at which an associated element occurs in a bitstream. In many of these embodiments, portions of the elements are allocated to faster and slower storage based on the probabilities. In some of these embodiments, elements having higher probabilities are allocated to the faster memory. In some of these embodiments, portions are allocated based on a cost associated with the use of storage, wherein the cost is indicative of processing time required to access data stored in a selected memory. In some of these embodiments, portions are allocated to minimize an aggregate measure of system cost, the measure including the sum of the product of probability of each element and cost of its associated memory. In some of these embodiments, allocation includes swapping a first element and a second element wherein the first element is initially located in fast memory and the second element is initially located in slow memory and wherein the first element has a smaller associated unconditional probability than the second element. In some of these embodiments, fast memory includes static RAM and memory collocated with a processor. In some of these embodiments, slow memory includes dynamic memory.

It is apparent that the above embodiments may be altered in many ways without departing from the scope of the invention. Further, various aspects of a particular embodiment may contain patentably subject matter without regard to other aspects of the same embodiment. Additionally, various aspects of different embodiments can be combined together. Also, those skilled in the art will understand that variations can be made in the number and arrangement of components illustrated in the above diagrams. It is intended that the appended claims include such changes and modifications.

What is claimed is:

1. A method for optimizing storage comprising the steps of:
   determining probabilities of occurrence for portions of one or more tables; and
   allocating the portions among a plurality of storage, each storage having an associated cost, wherein portions having highest probabilities are allocated to available storage having lowest costs.

2. A method according to claim 1, wherein the plurality of storage includes memory devices and the associated cost is related to access times of the memory devices.

3. A method according to claim 1, wherein the one or more tables includes at least one set of variable length coding (VLC) tables and each portion is a VLC table.

4. A method according to claim 3, and further comprising the steps of:
   associating a probability of occurrence with each element of the VLC tables; and
   swapping lower probability elements in lower-cost storage with higher probability elements in higher cost storage.

5. A method according to claim 4, wherein the step of swapping is performed iteratively to obtain a desired system cost.

6. A method according to claim 5, wherein desired system cost is measured by calculating the sum of the product of probability of each element and cost of its associated storage.

7. A method according to claim 3, wherein each set of VLC tables is used for decoding a bitstream encoded using one of a plurality of encoding schemes.

8. A method according to claim 7, wherein the plurality of encoding schemes includes Advanced Audio Coding (AAC), MPEG-3, MPEG-4, JPEG, JPEG-2000 and H.264.

9. A method according to claim 3, wherein the probabilities for the set of VLC tables are predetermined by an encoding system.

10. A method according to claim 3, wherein the probabilities for the set of VLC tables are updated based on usage during decoding of a bitstream.

11. A method according to claim 3, wherein the probabilities are obtained from analysis of the VLC tables.

12. A system for maintaining decode tables comprising:
    a plurality of storage areas, each storage area having an associated cost;
    one or more tables having a plurality of elements wherein each element has a corresponding probability of occurrence; and
    a sorter adapted to populate certain area of the plurality of storage areas with elements of the one or more tables, wherein storage areas having lowest cost are populated with elements having highest probability.

13. The system of claim 12, wherein the cost associated with each storage area includes a measure of access time for retrieving data from the each storage area.

14. The system of claim 13, wherein the sorter is further adapted to initially populate storage areas having lowest access times with tables having highest aggregate probabilities.

15. The system of claim 14, wherein the sorter is further adapted to swap lower probability elements initially sorted in lower-cost storage areas with higher probability elements initially stored in higher cost storage areas.

16. The system of claim 12, wherein the sorter comprises a processor configured to execute a sorting algorithm.

17. The system of claim 12, wherein each of the plurality of storage areas comprise one or more memory devices.

18. The system of claim 12, wherein the cost associated with each storage area includes a measure of degradation of system performance associated with exhaustion of storage capacity.

* * * * *